(12) United States Patent
Kasaoka et al.

(10) Patent No.: US 6,331,462 B1
(45) Date of Patent: Dec. 18, 2001

(54) MANUFACTURING METHOD OF A SEMICONDUCTOR DEVICE FOR DESIRED CIRCUIT PATTERNS

(75) Inventors: Tatsuo Kasaoka; Atsushi Hachisuka; Shinya Soeda, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/453,807

(22) Filed: Dec. 3, 1999

(30) Foreign Application Priority Data

Jun. 30, 1999 (JP) .................................................. 11-186526

(51) Int. Cl.[7] .............................................. H01L 21/8242
(52) U.S. Cl. ......................... 438/253; 438/241; 438/396; 438/398
(58) Field of Search ................................... 438/253, 254, 438/255, 396, 397, 398, 241

(56) References Cited

U.S. PATENT DOCUMENTS 5,843,817 * 12/1998 Lee et al. .............................. 438/239

FOREIGN PATENT DOCUMENTS 9-312380   12/1997 (JP) .
09312380 * 12/1997 (JP) .............................. H01L/27/108

OTHER PUBLICATIONS

Koji, "semiconductor device and manufacture thereof".*

* cited by examiner

Primary Examiner—Charles Bowers
Assistant Examiner—Yennhu B. Huynh
(74) Attorney, Agent, or Firm—McDermott, Will & Emery

(57) ABSTRACT

A semiconductor substrate is arranged to have a DRAM area in which to form at a high density gate electrodes of transistors serving as DRAM components, and a peripheral circuit area in which to form at a relatively low density gate electrodes of transistors as peripheral circuit components. A resist film is formed in corresponding relation to the gate electrodes of the DRAM. After an insulating film is etched, a resist film is formed in corresponding relation to the gate electrodes of the peripheral circuits. A conductive layer is then etched while the resist film and insulating film left in the DRAM area are being used as masks, whereby the gate electrodes are formed in the DRAM area and peripheral circuit area.

13 Claims, 13 Drawing Sheets

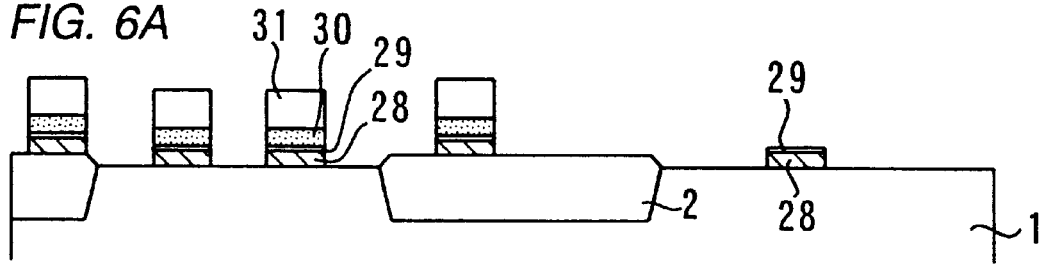
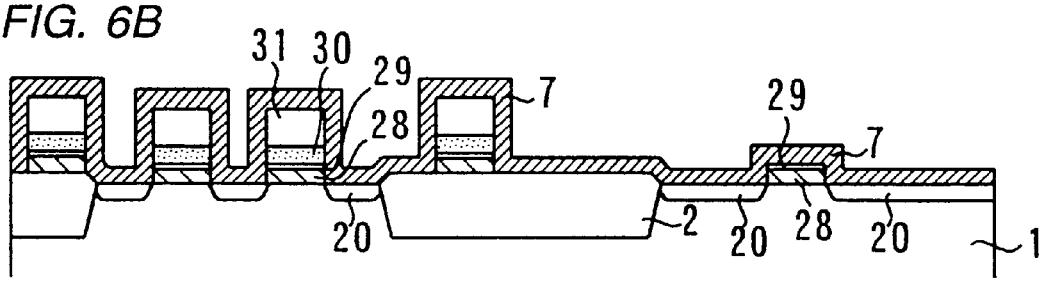
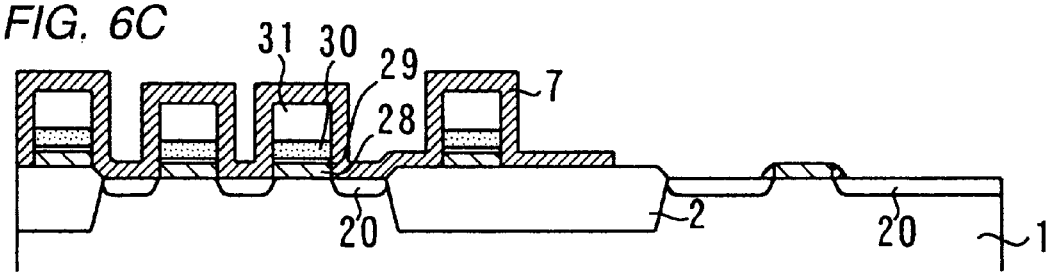
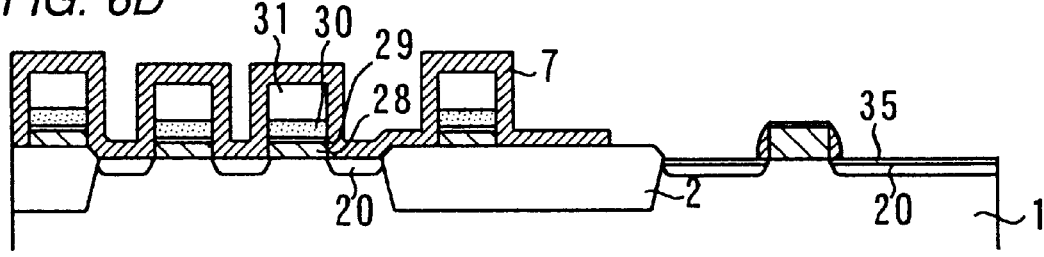

PRIOR ART

MANUFACTURING METHOD OF A SEMICONDUCTOR DEVICE FOR DESIRED CIRCUIT PATTERNS

BACKGROUND OF THE INVENTION

1. Field of the Invention

The present invention relates to a manufacturing method of a semiconductor device and, more particularly, to a manufacturing method of a semiconductor device suitable for manufacturing a semiconductor device that comprises both a DRAM (dynamic random access memory) and peripheral circuits such as logic circuits.

2. Description of the Background Art

FIG. 12 is a cross-sectional view showing a conventional structure of a semiconductor device that comprises both a DRAM and peripheral circuits such as logic circuits on a single substrate (called the DRAM hybrid IC hereunder). In that conventional DRAM hybrid IC, an isolation oxide film 2 is furnished on a semiconductor substrate 1. On the semiconductor substrate 1 are gate electrodes 6 made of a polysilicon layer 3, a tungsten (W) layer 4 and an oxide film 5 stacked one upon another.

The polysilicon layer 3 is made either of implanted polysilicon formed by implanting impurities into an impurity-free silicon layer, or of doped polysilicon deposited in a manner mixed with impurities. The polysilicon layer 3 and tungsten layer 4 constitute a conductive layer of a tungsten silicide structure.

The silicon substrate 1 of the DRAM hybrid IC carries on it components of a DRAM and those of peripheral circuits. In the description that follows, the area in which the DRAM components are provided is called the DRAM area, and the area where the peripheral circuit components are furnished is called the peripheral circuit area. In the conventional DRAM hybrid IC, the silicon substrate 1 has gate electrodes 6 of the same structure formed in both the DRAM area and the peripheral circuit area.

Each gate electrode 6 is surrounded by a silicon nitride film 7. In the DRAM area, the silicon nitride film 7 is formed so as to cover the top and sides of each gate electrode 6; in the peripheral circuit area, the silicon nitride film 7 is formed to constitute side walls of the gate electrodes 6.

The semiconductor substrate 1 further carries on it bit lines 10 of a tungsten silicide structure formed by a polysilicon layer 8 and a tungsten layer 9. As with the polysilicon layer 3 mentioned above, the polysilicon layer 8 is made of either implanted polysilicon or doped polysilicon. The bit lines 10 are formed inside contact holes that are manufactured by known self-alignment techniques.

Interlayer insulating films 11 and 12 are formed over the semiconductor substrate 1. In the DRAM area, lower electrodes 13 are formed to penetrate the interlayer insulating films 11 and 12 for conduction to the semiconductor substrate 1. The lower electrodes 13 are covered with a dielectric film 14 and upper electrodes 15. The lower electrodes 13, dielectric film 14 and upper electrodes 15 constitute capacitors 16 that function as memory cells of the DRAM.

In the peripheral circuit area, tungsten plugs 17 are formed to penetrate the interlayer insulating films 11 and 12 for conduction to the semiconductor substrate 1. On top of the interlayer insulating film 12 is another interlayer insulating film 18 that covers both the film 12 and the above-mentioned capacitors 16. The tungsten plugs 17 conduct to aluminum wires 19 that are furnished on the interlayer insulating film 18.

The semiconductor substrate 1 has impurity-diffused layers 20 formed at positions at which connecting to the lower electrodes 13 of the capacitor 16, to the tungsten plugs 17, and to the bit lines 10. The impurity-diffused layer 20 is formed so as to sandwich each gate electrode 6. On the semiconductor substrate 1, the impurity-diffused layer 20 functions as a source drain region of each transistor; while the portions covered with the gate electrodes 6 serve as channels of transistors.

FIGS. 13A to 13E are explanatory views depicting how a DRAM hybrid IC is conventionally manufactured. By such a conventional method, a polysilicon layer 3, a tungsten layer 4 and an oxide layer 5 are stacked one upon another all over the semiconductor substrate 1. The stacked layers are patterned by photolithography and through etching to form gate electrodes 6 in the DRAM area and in the peripheral circuit area (FIG. 13A).

From above the electrode gates 6, impurities are implanted into the semiconductor substrate 1 to form an impurity-diffused layer 20. A silicon nitride film 7 is formed all over the semiconductor substrate 1 so as to cover the impurity-diffused layer 20 and gate electrodes 6 (FIG. 13B).

With the silicon nitride film 7 protected by a resist film (not shown) in the DRAM area, the silicon nitride film 7 in the peripheral circuit area is etched. The etching process causes the silicon nitride film 7 to form side walls of the gate electrodes 6 in the peripheral circuit area (FIG. 13C). From above the silicon nitride film 7, impurities are implanted into the semiconductor substrate 1 at a predetermined angle relative to the latter. As a result, the impurity-diffused layer 20 in the peripheral circuit area takes on an LDD (lightly doped drain) structure.

An interlayer insulating film 11 is deposited all over the semiconductor substrate 1. Contact holes are formed by self-alignment techniques so as to communicate predetermined impurity-diffused layers 20 provided in the DRAM area. Bit lines 10 are then formed so as to conduct to the impurity-diffused layers 20 through the contact holes (FIG. 13D).

An interlayer insulating film 12 is formed on the bit lines 10 and interlayer insulating film 11. Contact holes are made through the interlayer insulating films 10 and 11 for conduction to predetermined impurity-diffused layers 20 provided in the DRAM area. Lower electrodes 13 are formed for conduction to the impurity-diffused layer 20 through the contact holes. A dielectric film 14 and an upper electrode 15 are formed to cover the lower electrodes 13, whereby capacitors 16 are constituted (FIG. 13E).

An interlayer insulating film 18 is then formed on the interlayer insulating film 12. Tungsten plugs 17 are formed in the peripheral circuit area, and aluminum wires 19 that conduct to the tungsten plugs 17 are fabricated, whereby the conventional DRAM hybrid IC is constructed (see FIG. 12).

In the DRAM hybrid IC, self-alignment techniques are used to make the contact holes in which to accommodate the bit lines 10. For that reason, the topmost layer of the gate electrodes 6 in the DRAM area should preferably be an oxide film 5. Meanwhile, the gate electrodes 6 in the peripheral circuit area should preferably have low levels of resistance. That is, the gate electrodes 6 in the peripheral circuit area should be so structured as to favor low resistance.

However, the conventional semiconductor manufacturing method involves manufacturing the gate electrodes 6 in the DRAM area and those in the peripheral circuit concurrently in the same step, as described above. This makes it practically impossible for the conventional method to make the gate electrodes 6 serving as DRAM components different in structure from the gate electrodes 6 acting as peripheral circuit components.

In the DRAM hybrid IC, the gate electrodes 6 are generally formed more densely in the DRAM area than their counterparts in the peripheral circuit area. For that reason, the gate electrodes 6 in the DRAM area need to be patterned more precisely than those in the peripheral circuit area during manufacture of the DRAM hybrid IC.

Conventionally, however, the gate electrodes 6 in the DRAM area and those in the peripheral circuit are to be formed in the same step. This makes it impossible for the conventional method to form, in separate steps, densely arranged gate electrodes 6 in the DRAM area and sparsely arranged gate electrodes 6 in the peripheral circuit area in such a manner that the respectively required levels of precision would be ensured for the gate electrode in the two distinct areas.

SUMMARY OF THE INVENTION

The present invention has been conceived to solve the previously-mentioned problems, and a general object of the present invention is to provide a novel and useful manufacturing method of a semiconductor device.

A more specific object of the present invention is to provide a manufacturing method of a semiconductor device for forming wiring layers of different structures on the same substrate.

It is a second object of the present invention to provide a manufacturing method of a semiconductor device for accurately forming both a dense component pattern and a sparse component pattern on the same substrate.

The above objects of the present invention are achieved by a manufacturing method of a semiconductor device for forming desired circuit patterns on a semiconductor substrate. In the manufacturing method, regions of the semiconductor substrate are divided into a high-density region principally including a high-density pattern and a low-density region principally including a low-density pattern. The manufacturing method includes a step of transferring a pattern to the high-density region by photolithography and a step of transferring a pattern to said low-density region by photolithography. The method also includes a step of forming on the semiconductor substrate the patterns transferred to the high-density region and the low-density region.

The above objects of the present invention are also achieved by another manufacturing method of a semiconductor device for forming desired circuit patterns on a semiconductor substrate. In the method, the desired circuit patterns are divided into a first and a second group pattern. The manufacturing method includes a step of transferring the first group pattern by photolithography and a step of transferring the second group pattern by photolithography. The method also includes a step of forming the first and the second group pattern on the semiconductor substrate. The first group pattern principally has a larger pitch than the circuit patterns to be formed. The second group pattern principally has a larger pitch than the circuit patterns to be formed.

The above objects of the present invention are further achieved by another manufacturing method of a semiconductor device for forming desired circuit patterns on a semiconductor substrate. In the method, regions of the semiconductor substrate are divided into a first region in which to form a first group pattern and a second region in which to form a second group pattern. The manufacturing method includes a step of forming a conductive layer and an insulating film on the semiconductor substrate. The method also includes a step of forming a first resist film corresponding to the first group pattern on the insulating film in the first region. The insulating film is etched while using the first resist film as a mask. Portions of the conductive layer which are exposed in the first region is etched while protecting the second region and using the insulating film left in the first region as a mask. A second resist film is formed to cover the first region and locations corresponding to the second group pattern. Portions of the conductive layer which are exposed in the second region is etched while using the second resist film as a mask.

Other objects and further features of the present invention will be apparent from the following detailed description when read in conjunction with the accompanying drawings.

BRIEF DESCRIPTION OF THE DRAWINGS

FIGS. 5A to 5D and FIGS. 6A to 6D are sectional views for describing a manufacturing method of a semiconductor device according to a third embodiment of the present invention;

DESCRIPTION OF THE PREFERRED EMBODIMENTS

Figure 1A:
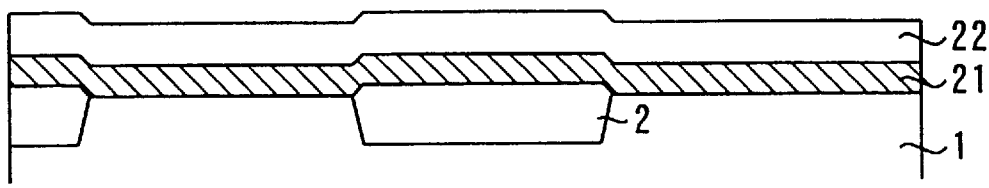
FIGS. 1A to 1E and FIGS. 2A to 2D are sectional views for describing a manufacturing method of a semiconductor device according to a first embodiment of the present invention.

In the following, principles and embodiments of the present invention will be described with reference to the accompanying drawings. Throughout the drawings, like reference characters designate like or corresponding parts, and their descriptions are omitted where they are repetitive.
First Embodiment FIGS. 1A to 1E and FIGS. 2A to 2D are explanatory views depicting a method practiced as a first embodiment of the invention for manufacturing a semiconductor device. This method is used to manufacture a DRAM hybrid IC that comprises a DRAM and peripheral circuits such as logic circuits on the same substrate.

By this manufacturing method, an isolation oxide film 2 is first formed on a semiconductor substrate 1. A conductive layer 21 and an insulating film 22 are deposited to cover the entire surface of the semiconductor substrate 1 (FIG. 1A). The conductive layer 21 may be constituted by an implanted polysilicon film, a doped polysilicon film, a silicide film, or a salicide film.

The implanted polysilicon film may be formed by implanting impurities into a polysilicon film deposited with no impurities contained therein. The doped polysilicon film may be formed by depositing an impurity-doped polysilicon film. The silicide film may be formed by depositing silicide, i.e., a reaction product derived from a reaction between silicon and metal. The salicide film may be produced by depositing metal from above a silicon film thus forming silicide in exposed portions of silicon.

Figure 1B:
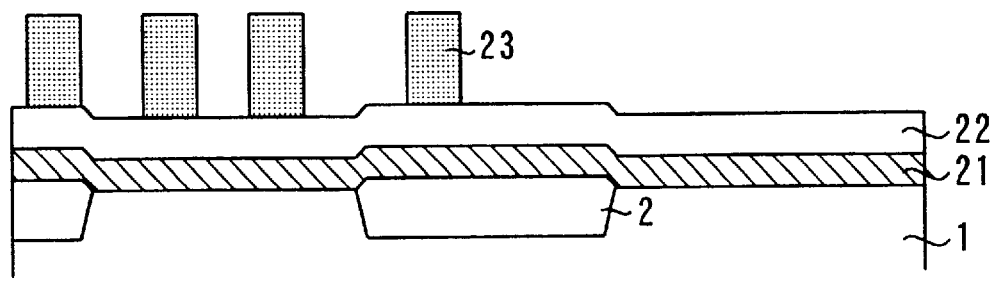

In FIGS. 1A to 1E, approximately the left-hand half region of the semiconductor substrate 1 is used as a DRAM area and the right-hand half as a peripheral circuit area. By this manufacturing method as the first embodiment, a resist film 23 is first patterned in the DRAM area (FIG. 1B). The resist film 23, made illustratively from a negative type resist material, has characteristics suitable for the formation of a narrow-minded pattern.

Figure 1C:
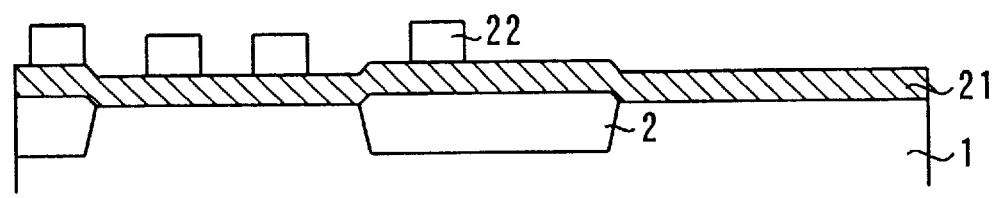

With the resist film 23 used as a mask, dry etching is carried out until the conductive layer 21 is exposed. The dry etching process leaves the insulating film 22 patterned as desired in the DRAM area. With the etching process completed, the remaining resist film 23 is removed (FIG. 1C).

Figure 1D:
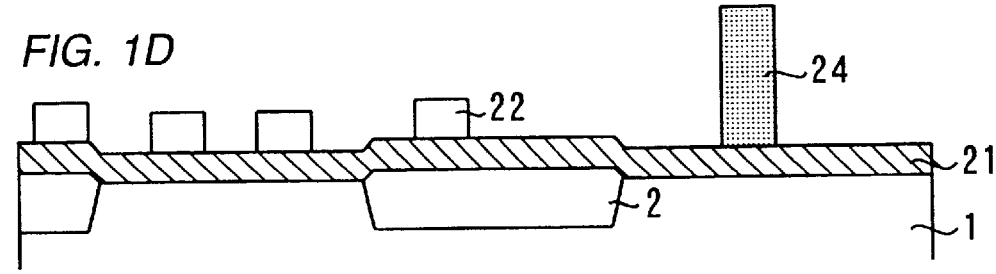

A resist film 24 is then patterned in the peripheral circuit area of the semiconductor substrate 1 (FIG. 1D). The resist film 24, made illustratively from a positive type resist material, has characteristics suitable for the formation of a wide-pitched pattern.

Figure 1E:
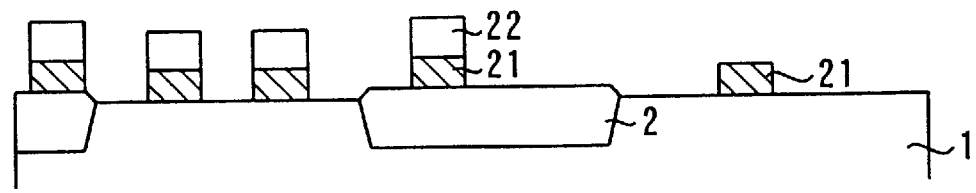

Dry etching is performed while the insulating film 22 in the DRAM area and the resist film 24 in the peripheral circuit area are being used as masks. The dry etching process causes gate electrodes made of the conductive layer 21 and insulating film 22 to be formed in the DRAM area, and gate electrodes made of the conductive layer 21 to be produced in the peripheral circuit area (FIG. 1E).

The DRAM hybrid IC requires that gate electrodes be formed more densely in the DRAM area than in the peripheral circuit area. In photolithography, meanwhile, the conditions for accurately transferring a dense pattern can be different from those for precisely transferring a sparse pattern. For that reason, margins of photolithography are appreciably less if a pattern of gate electrodes in the DRAM area and a pattern of gate electrodes in the peripheral circuit area are to be transferred simultaneously by a single photolithography process, than if the two patterns are transferred separately.

As described, this manufacturing method subjects the resist film 23 corresponding to the gate electrodes in the DRAM area and the resist film 24 corresponding to the gate electrodes in the peripheral circuit area to different steps of pattern transfer. Furthermore, the resist film 23 is formed from a resist material suitable for the formation of a dense pattern while the resist film 24 is made of a resist material fit for the formation of a sparse pattern. Thus the inventive method allows the gate electrodes in both the DRAM area and the peripheral circuit area to be formed accurately regardless of the pattern density differences.

Figure 2A:
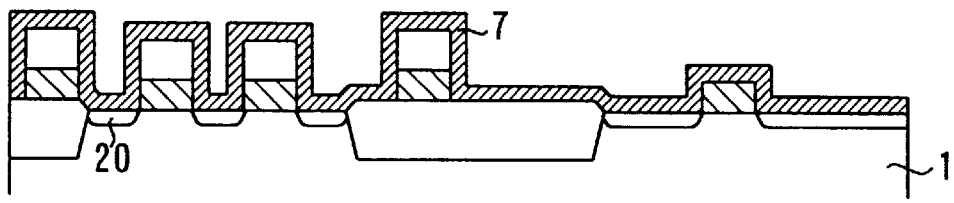

Impurities are implanted into the semiconductor substrate 1 from above the conductive layer 21 and insulating film 22 which constitute the gate electrodes. The implantation of impurities forms on the semiconductor substrate 1 an impurity-diffused layer 20 sandwiching the gate electrodes. A silicon nitride film 7 is formed over the semiconductor substrate 1 so as to cover the impurity-diffused layer 20 and gate electrodes (FIG. 2A).

Figure 2B:
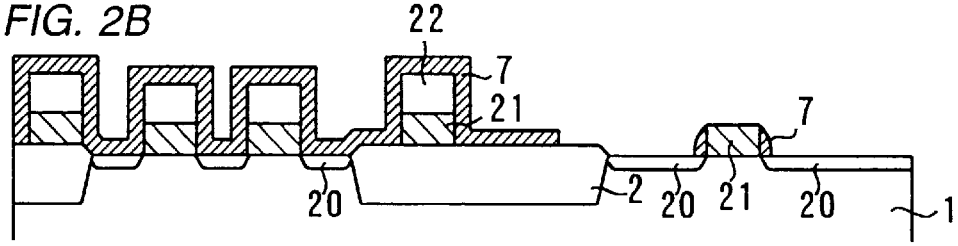

With the silicon nitride film 7 protected by a resist film (not shown) in the DRAM area, the silicon nitride film 7 in the peripheral circuit area is etched. The etching process forms in the peripheral circuit area the gate electrodes with their tops exposed and their sides covered with side walls of the silicon nitride film 7 (FIG. 2B). When the etching process is completed, impurities are implanted into the semiconductor substrate 1 at a predetermined angle relative to the latter. As a result, the impurity-diffused layer 20 of the LDD structure is formed in the peripheral circuit area.

Figure 2C:
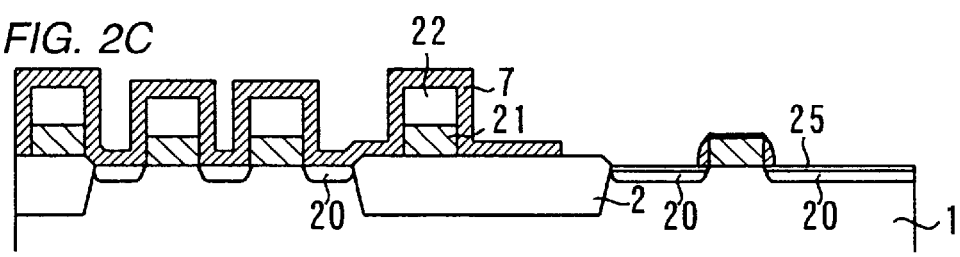

Metal such as cobalt (Co) is then deposited on the semiconductor substrate 1. At locations where silicon is exposed, a reaction between silicon and cobalt produces cobalt silicide. With the first embodiment, the steps above are carried out to form cobalt silicide (called the salicide film 25 hereunder) on the gate electrodes (conductive layer 21) and impurity-diffused layer 20 in the peripheral circuit area, i.e., on the surface of the gate electrodes of transistors formed in the peripheral circuit area and over the surface of the source drain areas of these transistors (FIG. 2C).

The salicide film 25 formed over the surfaces of the conductive layer 21 and impurity-diffused layer 20 reduces the resistance value of these layers (the resistance is called the wiring resistance hereunder). That is, the inventive method is capable of forming transistors of small wiring resistance in the peripheral circuit area.

An interlayer insulating film 11 is deposited to cover the entire top surface of the semiconductor substrate 1. Self-alignment techniques are then used to make contact holes opening to predetermined impurity-diffused layers 20 provided in the DRAM area. Bit lines 10 are formed through the contact holes for conduction to the impurity-diffused layer 20. An interlayer insulating film 12 is formed to cover the bit lines 10 and interlayer insulating film 11. Contact holes are then formed to penetrate through the interlayer insulating films 11 and 12 for conduction to predetermined impurity-diffused layers 20 provided in the DRAM area. Lower electrodes 13 are formed so as to conduct to the impurity-diffused layers 20 through the contact holes. A dielectric film 14 and upper electrodes 15 are formed so as to cover the lower electrodes 13, whereby capacitors 16 are constructed (FIG. 2D).

Thereafter, an interlayer insulating film 18 is formed to cover the interlayer insulating film 12 and capacitors 16. Tungsten plugs 17 are formed in the peripheral circuit area, and aluminum wires 19 that conduct to the tungsten plugs 17 are manufactured, whereby a DRAM hybrid IC is constructed (see FIG. 12).

Figure 2D:
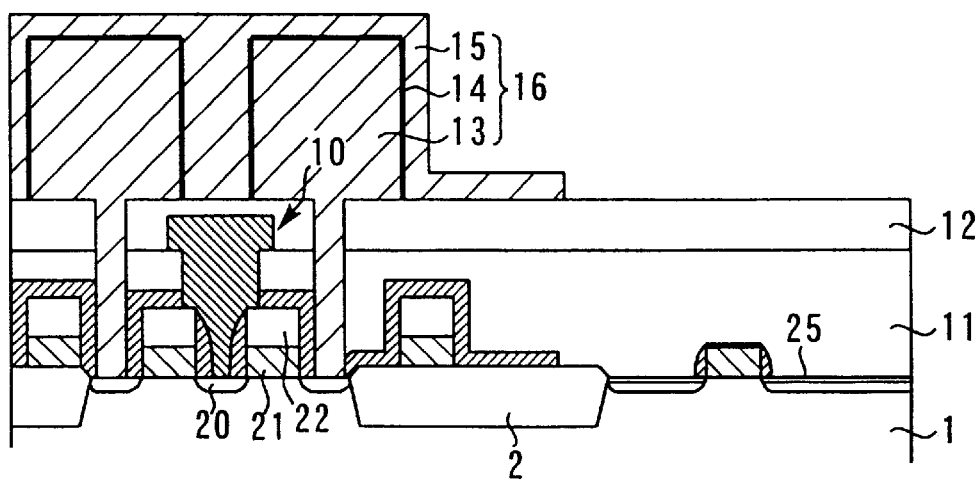

As shown in FIG. 2D, according to the manufacturing method practiced as the first embodiment, the gate electrodes in the DRAM area are given a two-layer structure formed of the conductive layer 21 and insulating film 22, while the gate electrodes and source drain areas in the peripheral circuit area acquire a structure containing the salicide film 25. When the contact holes for the bit lines 10 are formed by self-alignment techniques, the topmost layer of the gate electrodes in the DRAM area must be an oxide film. On the other hand, if it is desired to provide the transistors of the peripheral circuits with excellent electrical characteristics, the gate electrodes in the peripheral circuit area should preferably possess a structure fit to form the salicide film 25. In other words, the top of the conductive layer 21 should preferably be free of the oxide film(i.e., insulating film 22).

According to the first embodiment, the gate electrodes in the DRAM area and those in the peripheral circuit area are patterned in different steps so that they may be given different structures. That is, the gate electrodes in the DRAM area are specifically structured as desired, described above, and so are the gate electrodes in the peripheral circuit area. This makes it possible for the inventive method to manufacture at a high yield rate DRAM hybrid ICs of high reliability and excellent electrical characteristics.

With the first embodiment, the resist film 23 for forming the gate electrodes in the DRAM area and the resist film 24 for constituting the gate electrodes in the peripheral circuit area have so far been described as made of different resist materials. However, the present invention is not limited to this embodiment. The two resist films may alternatively be formed from the same resist material.

Second Embodiment

Figure 3A:
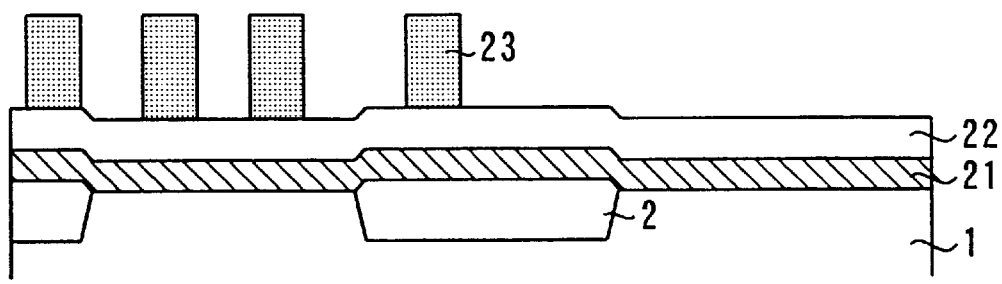
FIGS. 3A to 3D and FIGS. 4A and 4B are sectional views for describing a manufacturing method of a semiconductor device according to a second embodiment of the present invention.
Figure 3B:
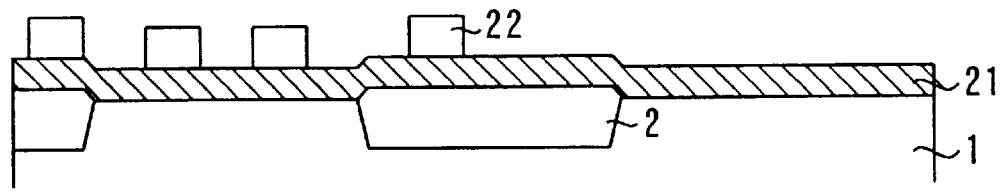

A second embodiment of this invention will now be described with reference to FIGS. 3A to 3D and FIGS. 4A and 4B. FIGS. 3A to 3D and FIGS. 4A and 4B are explanatory views illustrating a method practiced as the second embodiment of the invention for manufacturing a semiconductor device. As with the first embodiment (see FIGS. 1A to 1C), the second embodiment involves patterning an insulating film 22 in the DRAM area by use of a resist film 23 fit for constructing a dense-pitched pattern (FIGS. 3A and 3B).

Figure 3C:
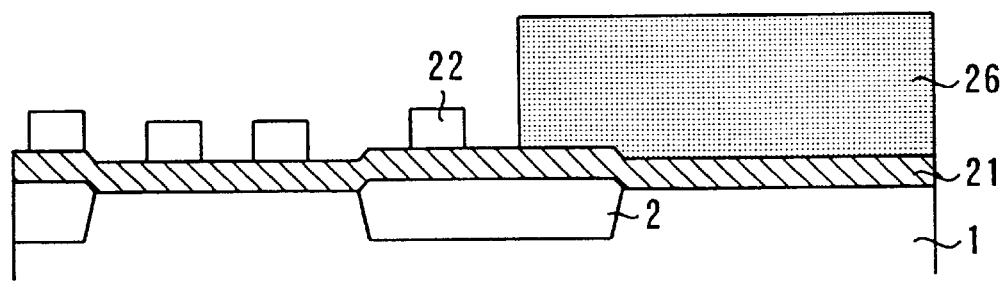

With this manufacturing method, a resist film 26 is then formed to cover the entire surface of the peripheral circuit area (FIG. 3C).

Figure 3D:
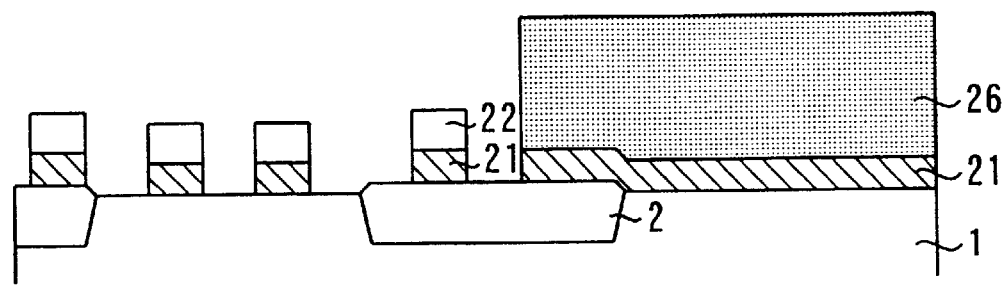

With a conductive layer 21 protected by the resist film 26 in the peripheral circuit area, dry etching is carried out using the insulating film 22 as a mask. The dry etching process forms gate electrodes made of the conductive layer 21 and insulating film 22 in the DRAM area (FIG. 3D).

According to the second embodiment, a resist film 27 is then formed (FIG. 4A) all over the DRAM area and at predetermined regions in the peripheral circuit area (i.e., at regions where gate electrodes are to be formed). Like the resist film 24 used in the first embodiment, the resist film 27 has characteristics suitable for forming a wide-pitched pattern.

Figure 4A:
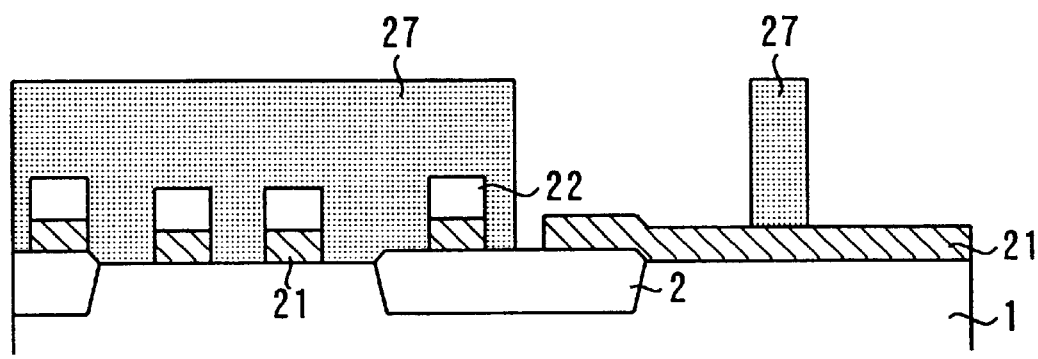
Figure 4B:
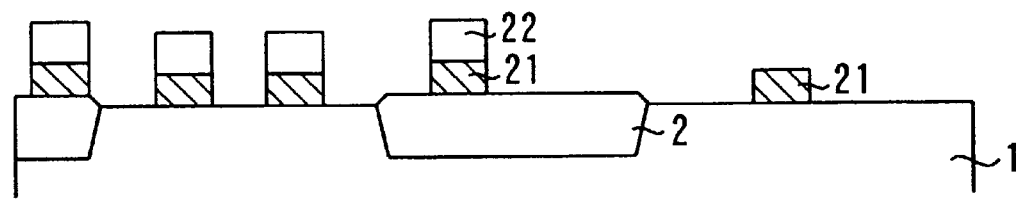

Dry etching is performed using the resist film 27 as a mask so that the conductive layer 21 left exposed in the peripheral circuit area is removed. After the dry etching process is completed, the resist film 27 is removed. This produces the gate electrodes made of the conductive layer 21 and insulating film 22 in the DRAM area, and the gate electrodes constituted by the conductive layer 21 in the peripheral circuit area (FIG. 4B). Thereafter, the same steps as those used in the first embodiment are carried out to fabricate a DRAM hybrid IC (see FIGS. 2A to 2D).

As described, the second embodiment, like the first embodiment, allows the resist film 23 for forming the gate electrodes in the DRAM area and the resist film 27 for constructing the gate electrodes in the peripheral circuit area to be produced in separate steps. As such, the second embodiment provides the same benefits as those offered by the first embodiment.

According to the second embodiment, the etching of the conductive layer 21 for forming the gate electrodes in the DRAM area is executed independently of the etching of the conductive layer 21 for constructing the gate electrodes in the peripheral circuit area. It is well known that the etching conditions for accurately forming a dense pattern may not be the same as those for precisely forming a sparse pattern. With that aspect taken into account, the second embodiment is fit for separately etching the conductive layers 21 in the DRAM area and in the peripheral circuit area under suitably different conditions in accordance with the respective pattern densities of the two areas. For that reason, the second embodiment allows the gate electrodes in the DRAM area and those in the peripheral circuit area to be formed with a higher degree of precision than the first embodiment.

With the second embodiment, the resist film 23 for forming the gate electrodes in the DRAM area and the resist film 27 for constituting the gate electrodes in the peripheral circuit are assumed to be made of different resist materials. However, the present invention is not limited to the embodiment. The two resist films may alternatively be formed from the same resist material.

Third Embodiment

Figure 5A:
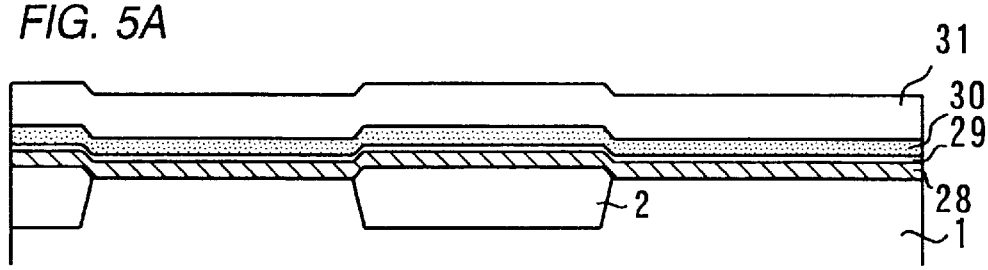

A third embodiment of this invention will now be described with reference to FIGS. 5A to 5D and FIGS. 6A to 6D. FIGS. 5A to 5D and FIGS. 6A to 6D are explanatory views showing a method practiced as the third embodiment of the invention for manufacturing a semiconductor device. The third embodiment involves initially forming an isolation oxide film 2 on the semiconductor substrate 1. A polysilicon layer 28 is formed to cover the entire top surface of the semiconductor substrate 1. On the polysilicon layer 28 are a stopper film 29, a silicide film 30 and an insulating film 31 deposited one upon another (FIG. 5A).

The polysilicon layer 28 is constituted by implanted polysilicon or doped polysilicon. The stopper film 29 is formed by a silicon oxide film or silicon nitride film. The silicide film 30 is made illustratively of a tungsten silicide film. The insulating film 31 is formed with a silicon oxide film.

Figure 5B:
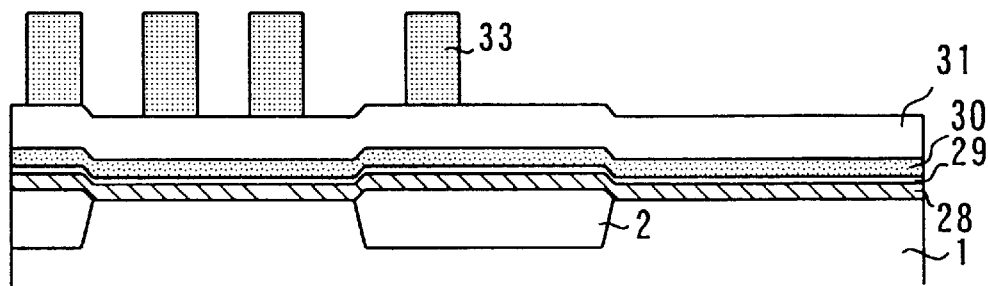

A resist film 33 is patterned in the DRAM area on the semiconductor substrate 1 (FIG. 5B). As with the resist film 23 for the first embodiment, the resist film 33 is made of a resist material having characteristics suitable for the formation of a narrow-pitched pattern.

Figure 5C:
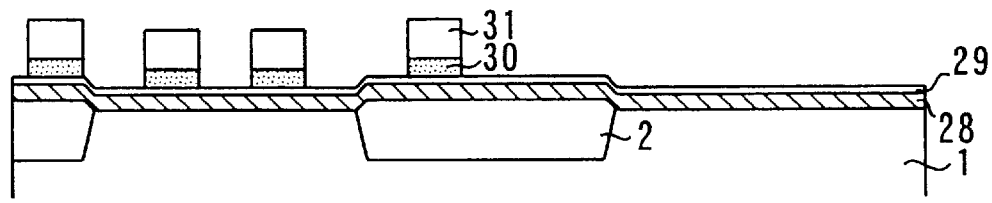

With the resist film 33 used as a mask, dry etching is carried out to remove the silicide film 30 and insulating film 31. The advance of the dry etching process is halted by the stopper film 29. The etching process leaves the silicide film 30 and insulating film 31 patterned as desired in the DRAM area (FIG. 5C).

Figure 5D:
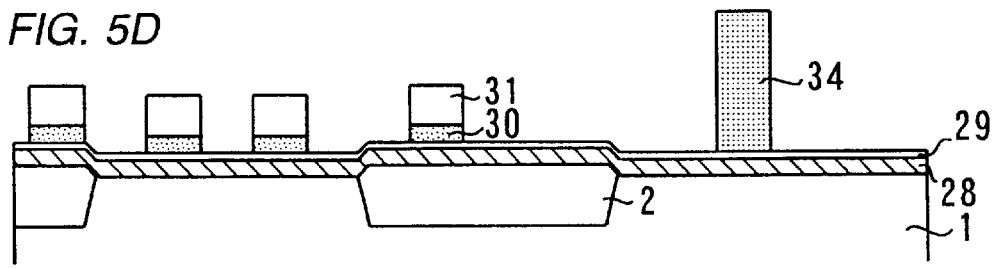

A resist film 34 is patterned in the peripheral circuit area of the semiconductor substrate 1 (FIG. 5D). As with the resist film 24 for the first embodiment, the resist film 34 is made of a resist material having characteristics suitable for the formation of a wide-pitched pattern.

Dry etching is performed while the insulating film 31 and silicide film 30 left in the DRAM area and the resist film 34 formed in the peripheral circuit area are being used as masks. The dry etching process causes the polysilicon layer 28, stopper film 29, silicide film 30 and insulating film 31 to be patterned as desired in the DRAM area, and the polysilicon layer 28 and stopper film 29 to be patterned as required in the peripheral circuit area (FIG. 6A).

An impurity-diffused layer 20 is formed on the semiconductor substrate 1. A silicon nitride film 7 is then formed to cover the impurity-diffused layer 20 and gate electrodes (FIG. 6B).

Etching the silicon nitride film 7 in the peripheral circuit area forms the film 7 into side walls in that area. At this point, the stopper film 29 covering the surface of the gate electrodes (polysilicon layer 28) is removed simultaneously (FIG. 6C).

Figure 12:
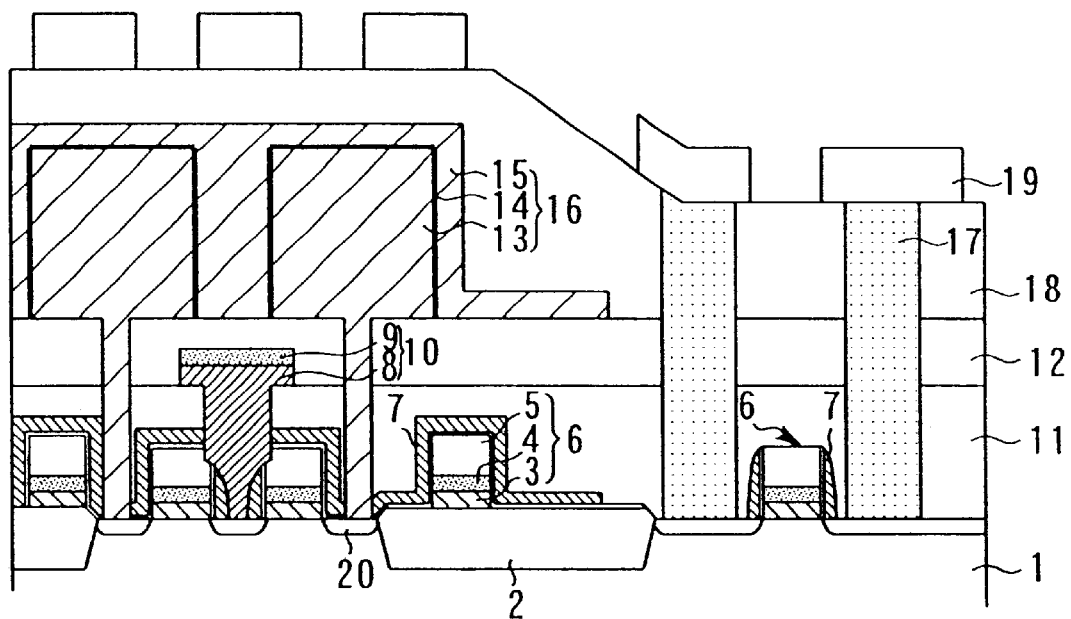
FIG. 12 is a sectional view showing a conventional semiconductor device.
Figure 13A:
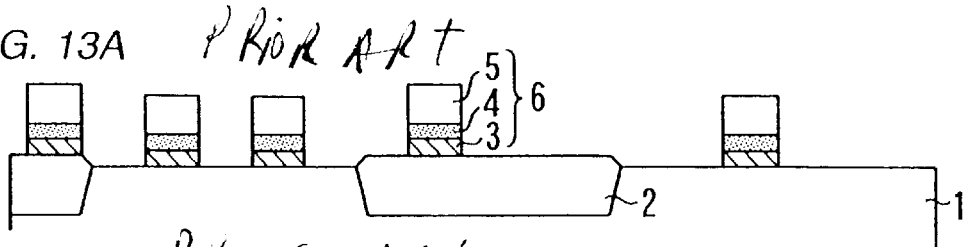
FIGS. 13A to 13E are sectional views for describing a conventional manufacturing method of a semiconductor device.
Figure 13B:
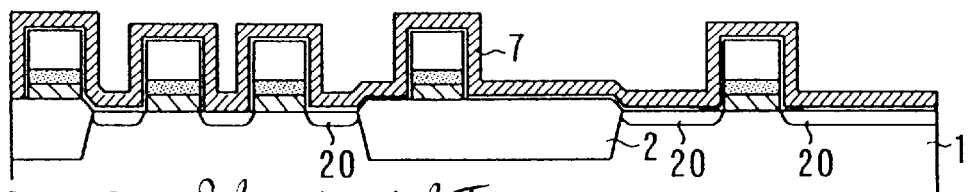
Figure 13C:
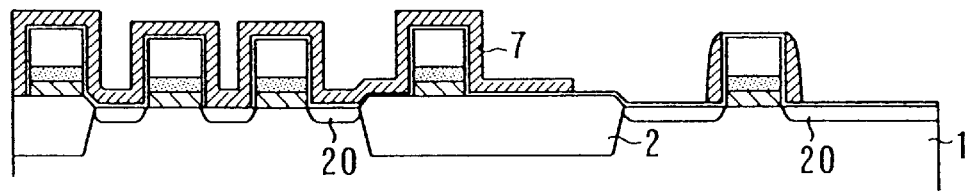
Figure 13D:
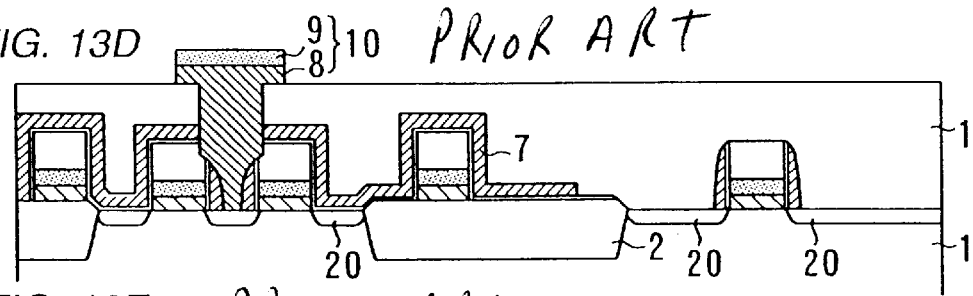
Figure 13E:
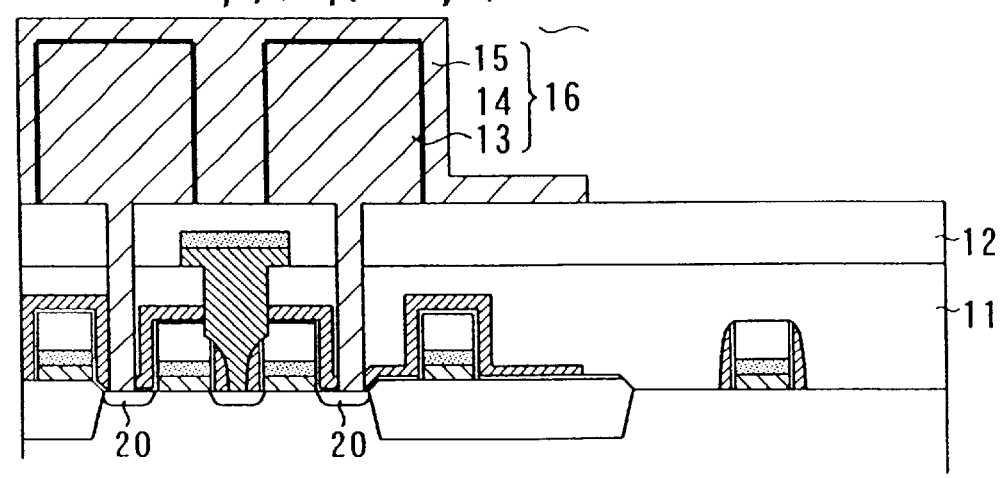

Thereafter, the same steps as those used in the first embodiment are carried out to turn the impurity-diffused layer 20 into an LDD structure in the peripheral circuit area; to form a salicide film 35 in the peripheral circuit area (FIG. 6D); and to fabricate capacitors 16 and tungsten plugs 17, whereby a DRAM hybrid IC is manufactured (see FIGS. 2D and 12).

As described, the third embodiment, like the first embodiment, allows the resist film 33 for forming the gate electrodes in the DRAM area and the resist film 34 for constructing the gate electrodes in the peripheral circuit area to be produced in separate steps. The third embodiment, as with the first embodiment, thus makes it possible to form the gate electrodes in the DRAM area and those in the peripheral circuit area with a high degree of precision regardless of the pattern density differences.

According to the third embodiment, as shown in FIG. 6D, the gate electrodes of a silicide structure are formed in the DRAM area, and a wiring structure containing the salicide film 35 is produced in the peripheral circuit area. This manufacturing method is thus suitable for producing a DRAM hybrid IC fit to operate at high speed with sufficiently reduced wiring resistance in both the DRAM area and the peripheral circuit area.

With the third embodiment, the resist film 33 for forming the gate electrodes in the DRAM area and the resist film 34 for constituting the gate electrodes in the peripheral circuit are assumed to be made of different resist materials. However, the present invention is not limited to this embodiment. The two resist films may alternatively be formed with the same resist material.

Fourth Embodiment

Figure 7A:
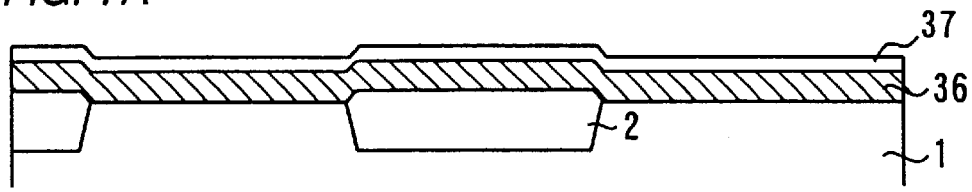
FIGS. 7A to 7E are sectional views for describing a manufacturing method of a semiconductor device according to a fourth embodiment of the present invention.

A fourth embodiment of this embodiment will now be described with reference to FIGS. 7A to 7E. FIGS. 7A to 7E are explanatory views describing a method practiced as the fourth embodiment of the invention for manufacturing a semiconductor device. As with the first embodiment, the fourth embodiment involves forming a conductive layer 36 and an insulating film 37 successively over the semiconductor substrate 1 in which an isolation oxide film 2 is formed (FIG. 7A).

Figure 7B:
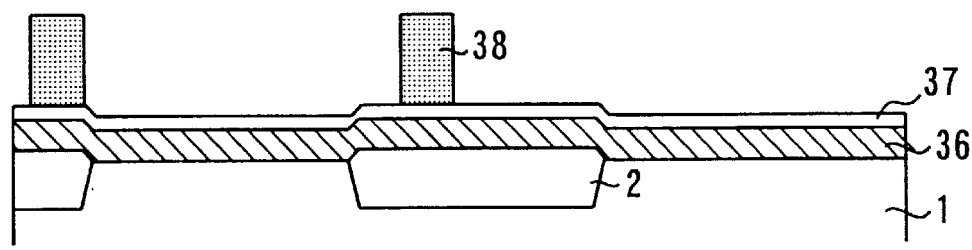

A resist film 38 is then patterned in the DRAM area of the semiconductor substrate 1. The resist film 38 is formed at locations corresponding to a group of gate electrodes constituting certain part of all gate electrodes to be formed in the DRAM area (FIG. 7B). The gate electrodes in that group are called the first group gate electrodes hereunder.

Figure 7C:
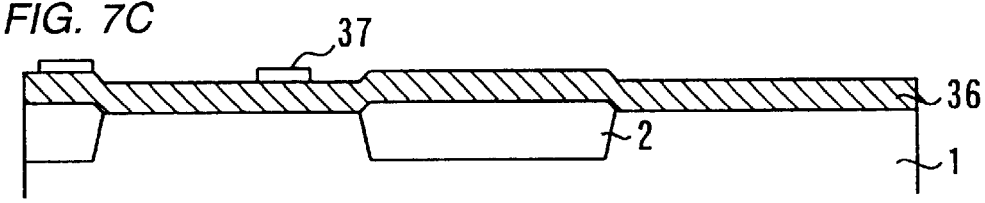

With the resist film 38 used as a mask, dry etching is carried out until the conductive layer 36 is exposed. The dry etching process leaves the insulating film 37 patterned so as to correspond to the first group gate electrodes (FIG. 7C).

Figure 7D:
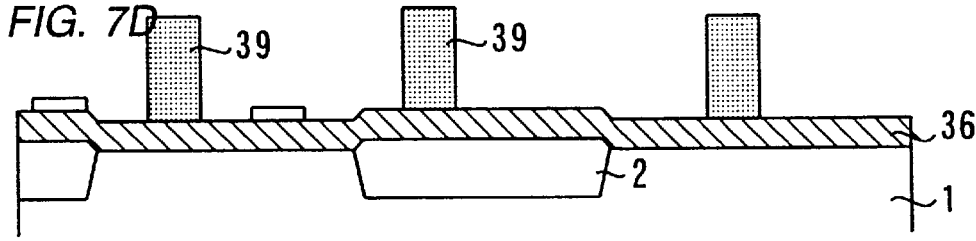

A resist film 39 is then patterned in the DRAM area and peripheral circuit area of the semiconductor substrate 1. The resist film 39 covers locations corresponding to the gate electrodes which are part of the all gate electrodes to be formed in the DRAM area and are not included in the first group gate electrodes, as well as locations corresponding to all gate electrodes to be formed in the peripheral circuit area (FIG. 7D). These gate electrodes covered by the resist film 39 are called the second group gate electrodes hereunder.

Figure 7E:
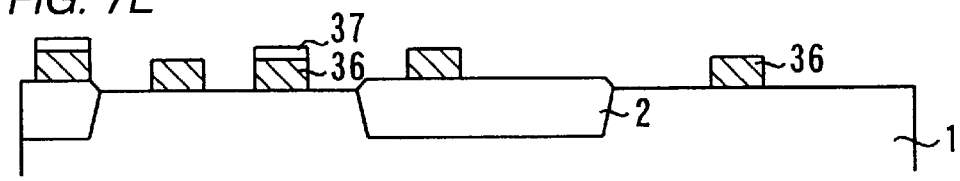

Dry etching is carried out while the insulating film 37 patterned in the DRAM area and the resist film 39 formed in both the DRAM area and the peripheral circuit area are being used as masks. The dry etching process forms on the semiconductor substrate 1 the first group gate electrodes made of the conductive layer 36 and insulating film 37, as well as the second group gate electrodes constituted solely by the conductive layer 36 (FIG. 7E).

With the fourth embodiment, the first and second group gate electrodes are established so that they are arranged alternately in the DRAM area. That is, arrangements are made so that the first and second group gate electrodes have a larger pitch than all gate electrodes formed in the DRAM area.

The larger the pattern pitch, the easier the transfer of the gate electrode pattern. For that reason, the fourth embodiment makes it easier to form the gate electrodes than if the patterns of all gate electrodes to be formed in the DRAM area are transferred in a single photolithography process.

Fifth Embodiment

A fifth embodiment of this invention will now be described with reference to FIGS. 8A to 8F. FIGS. 8A to 8F are explanatory views describing a method practiced as the fifth embodiment of the invention for manufacturing a semiconductor device. The fifth embodiment is a method for forming wires on a semiconductor substrate.

Figure 8A:
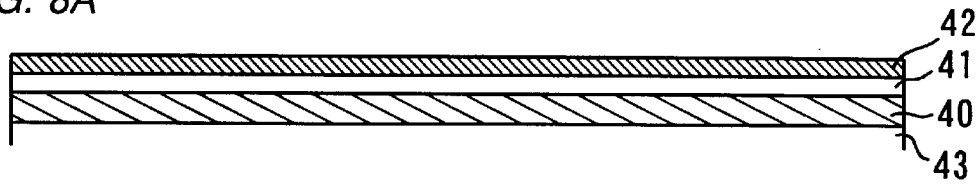
FIGS. 8A to 8F are sectional views for describing a manufacturing method of a semiconductor device according to a fifth embodiment of the present invention.

The fifth embodiment involves initially forming a conductive layer 40, an insulating film 41 and a conductive layer equivalent film 42 one upon another on an insulating film 43 (FIG. 8A). The conductive layer equivalent film 42 is constituted by the same material as that of the conductive layer 40 or by a material having the same etching rate as that of the conductive layer 40.

Figure 8B:
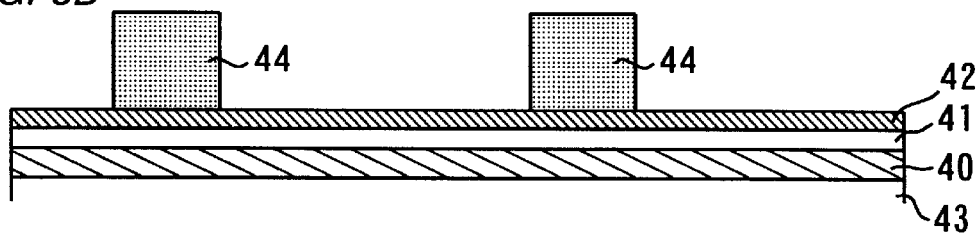

A resist film 44 is patterned on the conductive layer equivalent film 42. The resist film 44 is formed at locations corresponding to a group of wires constituting part of all wires to be formed on the semiconductor substrate (FIG. 8B). The wires in that group are called the first group wires hereunder.

Figure 8C:
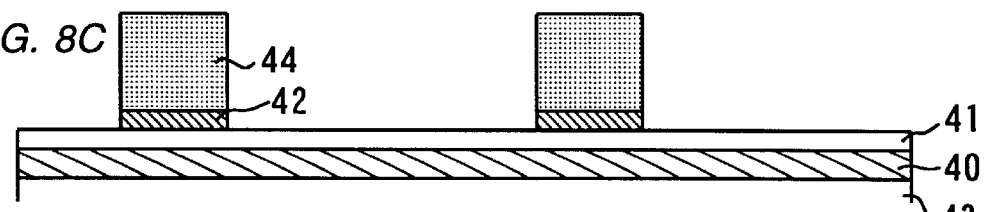

With the resist film 44 used as a mask, dry etching is carried out until the insulating film 41 is exposed. The dry etching process leaves the conductive layer equivalent film 42 patterned so as to correspond to the first group wires on the insulating film 41 (FIG. 8C).

Figure 8D:
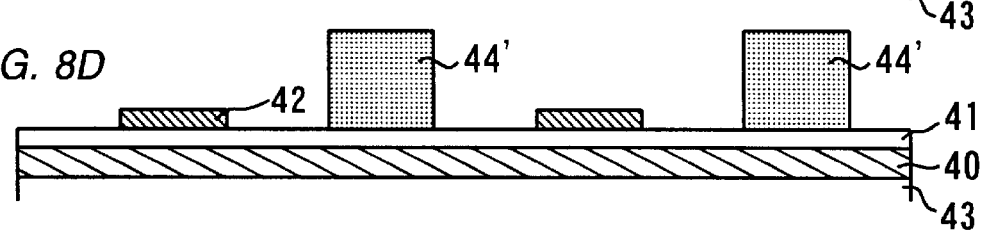

After the resist film 44 is removed, a resist film 44' is patterned on the insulating film 41. The resist film 44' covers locations corresponding to all wires to be formed on the semiconductor substrate with the exception of the first group wires (FIG. 8D). These wires covered by the resist film 44' are called the second group wires hereunder.

Figure 8E:
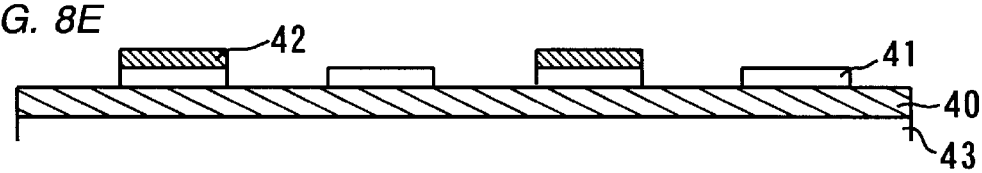
Figure 8F:
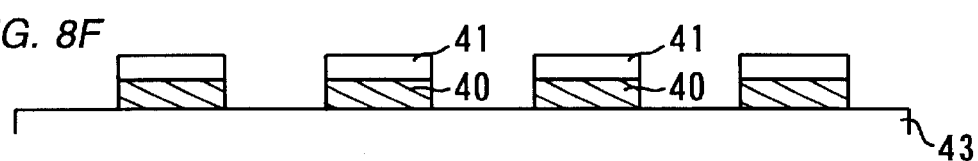

The insulating film 41 is etched while the conductive layer equivalent film 42 and resist film 44' patterned on the insulating film 41 are being used as masks. The etching process forms, on the conductive layer 40, a layered film structure made of the insulating film 41 and conductive layer equivalent film 42 at the locations corresponding to the first group wires, and a single film structure made of the insulating film 41 at the locations corresponding to the second group wires (FIG. 8E).

Etching the entire surface of the semiconductor substrate removes the conductive layer equivalent film 42 left on the insulating film 41 as well as the exposed conductive layer 40. The etching process forms the first and the second group of wires each in a dual layer structure made of the conductive layer 40 and insulating film 41 on the insulating film 43.

With the fifth embodiment, the first and second group wires are established so that they are arranged alternately on the semiconductor substrate. That is, arrangements are made so that the first and second group wires have a larger pitch than all wires formed on the semiconductor substrate.

The larger the pattern pitch, the easier the transfer of the wiring pattern. For that reason, the fifth embodiment makes it easier to form the wiring than if the patterns of all wires to be formed on the semiconductor substrate are transferred in a single pass of photolithography.

The fifth embodiment has been described as a method for forming wires on the semiconductor substrate. However, the objects to be formed are not limited to wires; gate electrodes may be formed instead by the fifth embodiment. According to the fifth embodiment, it is possible to form gate electrodes having the same layered structure in the DRAM area.

Sixth Embodiment

A sixth embodiment of this invention will now be described with reference to FIGS. 9A to 9F. FIGS. 9A to 9F are explanatory views picturing a method practiced as the sixth embodiment of the invention for manufacturing a semiconductor device. The sixth embodiment is another method for forming wires on a semiconductor substrate.

Figure 9A:
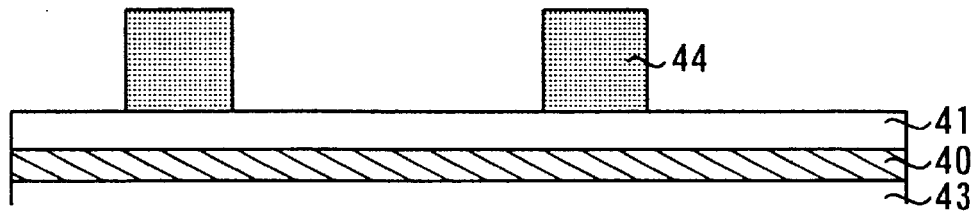
FIGS. 9A to 9F are sectional views for describing a manufacturing method of a semiconductor device according to a sixth embodiment of the present invention.

According to the sixth embodiment, a conductive layer 40 and an insulating film 41 are formed successively on an insulating film 43. On the insulating film 41, a resist film 44 is patterned at locations corresponding to part of all wires to be formed on the semiconductor substrate, i.e., corresponding to a first group of wires (FIG. 9A).

Figure 9B:
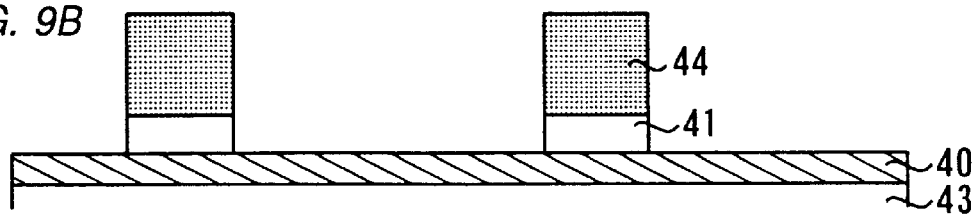

With the resist film 44 used as a mask, dry etching is carried out until the conductive film 40 is exposed. The dry etching process leaves the insulating film 41 patterned in corresponding relation to the first group wires on the conductive layer 40 (FIG. 9B).

Figure 9C:
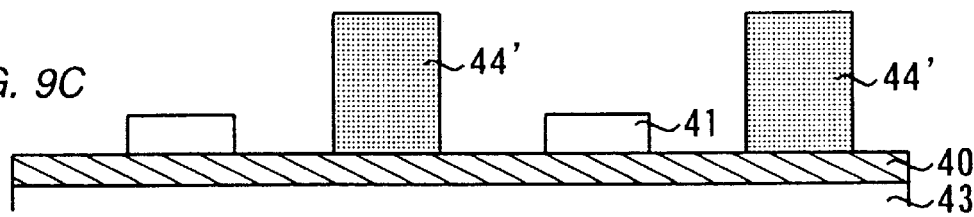

After the resist film 44 is removed, a resist film 44' is patterned on the conductive layer 40. The resist film 44' covers locations corresponding to all wires to be formed on the semiconductor substrate with the exception of the first group wires, i.e., corresponding to a second group of wires (FIG. 9C).

Figure 9D:
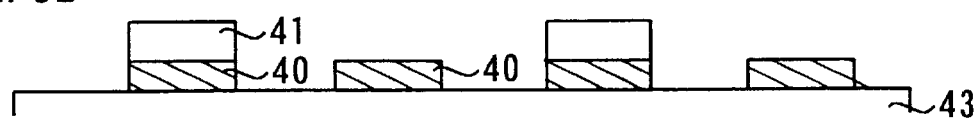

The conductive layer 40 is etched while the insulating film 41 and resist film 44' patterned on the conductive layer 40 are being used as masks. The etching process forms on the insulating film 43 the first group of wires made of the conductive layer 40 and insulating film 41, as well as the second group of wires constituted by the conductive layer 40 (FIG. 9D).

As described above, according to the sixth embodiment, two differently structured groups of wiring are formed on the semiconductor substrate. As with the fifth embodiment, the sixth embodiment allows the first and second group wires to be established so that they are arranged alternately on the semiconductor substrate. Thus the sixth embodiment, like the fifth embodiment, makes it easier to form wires in the semiconductor device than before.

According to the sixth embodiment, the first group wires are formed so that the surface of the conductive layer 40 is covered with the insulating film 41 while the second group wires are formed so that the surface of the conductive layer 40 is exposed. If the conductive layer 40 is constituted by implanted polysilicon or by doped polysilicon, then the above-described different structures of wiring may be utilized in giving different resistivities to the first and the second group of wires.

Figure 9E:
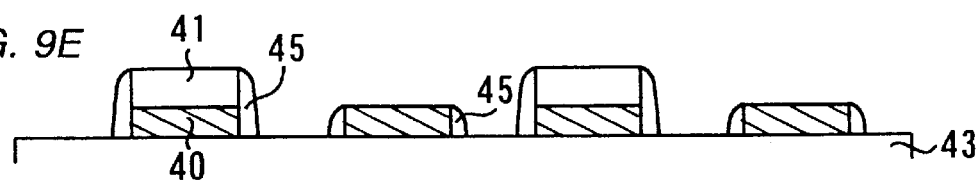

The resistivity of the first group wires and that of the second group wires are made different illustratively by carrying out the following steps: the wires are furnished laterally with side walls 45 made of an insulating film (FIG. 9E).

Figure 9F:
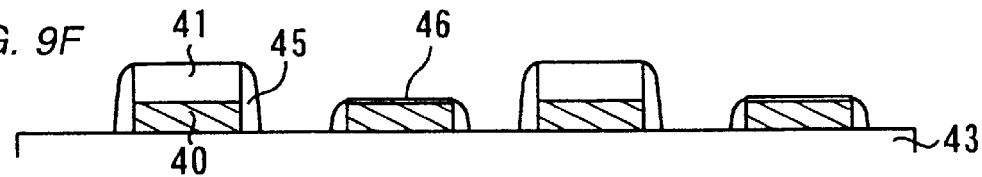

Metal such as cobalt or tungsten is then deposited all over the semiconductor substrate. At locations where silicon is exposed, a reaction between silicon and the metal produces silicide. As a result, a salicide film 46 is formed in a self-aligning fashion on the surface of the second group wires only (FIG. 9F). The sixth embodiment thus renders the resistivity of the second group wires lower than the resistivity of the first group wires.

In the steps described above, the metal is deposited after fabrication of the side walls 45 to prevent a salicide film from being formed on the sides of the wires. Alternatively, the resistivities of the first and the second groups of wires can be made different without fabrication of the side walls 45. If construction of the side walls 45 is omitted, depositing metal over the semiconductor substrate forms a salicide film on the sides of the first group wires as well as on the tops and sides of the second group wires. In such a case, the resistivity of the first group wires becomes different from the resistivity of the second group wires due to a difference in salicide film area over the two groups of wires. Thus without forming the side walls 45, the sixth embodiment still manufactures two kinds of wiring having different resistivities on the same substrate.

Seventh Embodiment

A seventh embodiment of this invention will now be described with reference to FIGS. 10A to 10G. FIGS. 10A to 10G are explanatory views depicting a method practiced as the seventh embodiment of the invention for manufacturing a semiconductor device. The seventh embodiment is another method for forming wires on a semiconductor substrate.

Figure 10A:
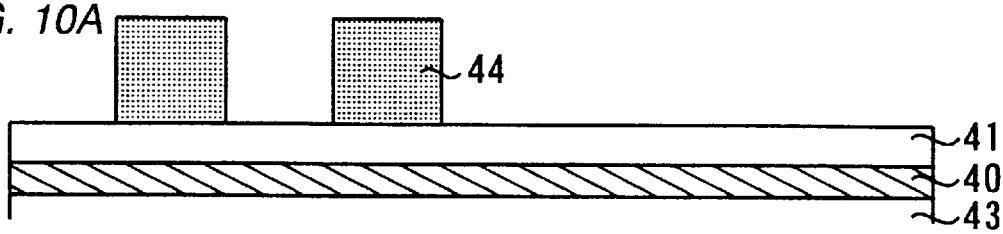
FIGS. 10A to 10G are sectional views for describing a manufacturing method of a semiconductor device according to a seventh embodiment of the present invention.

According to the seventh embodiment, a conductive layer 40 and an insulating film 41 are formed successively on an insulating film 43. The area of the semiconductor substrate is divided into a region where first group wires are to be formed (called the first region hereunder) and a region where second group wires are to be manufactured (called the second region hereunder). With the seventh embodiment, a resist film 44 is patterned in the first region on the insulating film 41 (FIG. 10A).

Figure 10B:
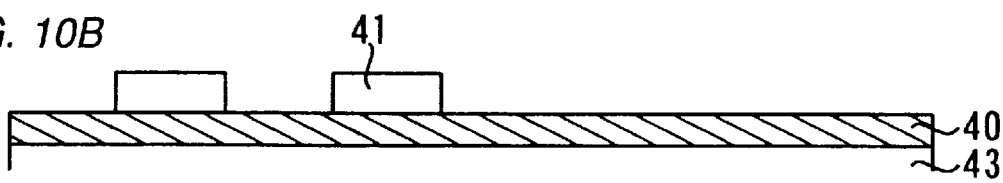

With the resist film 44 used as a mask, dry etching is carried out until the conductive layer 40 is exposed. The dry etching process leaves the insulating film 41 patterned so as to correspond to the first group wires on the conductive layer 40 (FIG. 10B).

Figure 10C:
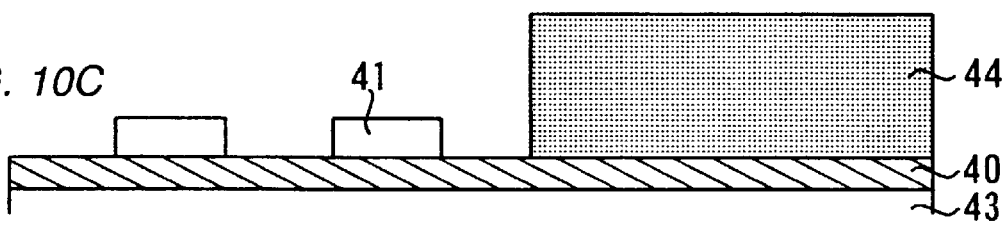

A resist film 44 is formed on the conductive layer 40 in the second region in order to protect the layer 40 (FIG. 10C).

Figure 10D:
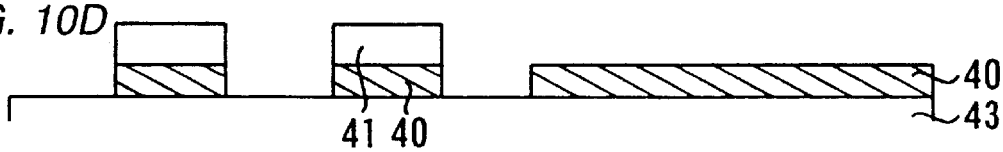

Dry etching is performed until the insulating film 43 is exposed in the first region while the insulating film 41 patterned in the first region and the resist film 44 formed in the second region are being used as masks. The dry etching process forms the first group wires made of the conductive layer 40 and insulating film 41 in the first region. When the etching process is completed, the resist film 44 is removed from the second region (FIG. 10D).

Figure 10E:
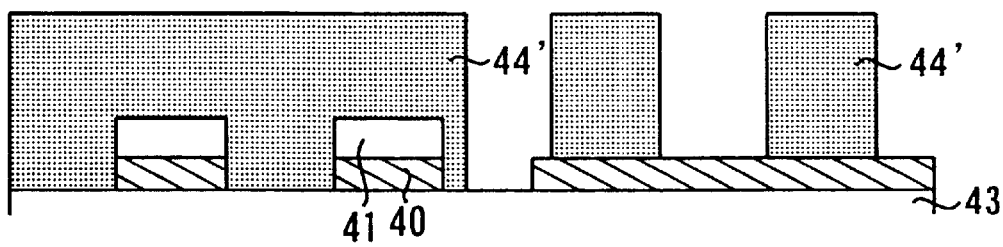

A resist film 44' is formed to cover the first group wires in the first region and appropriate locations in the second region (FIG. 10E).

Figure 10F:
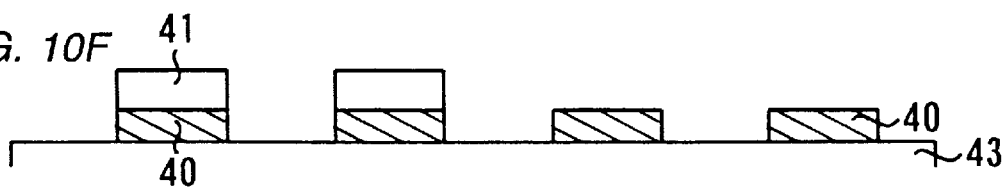
Figure 10G:
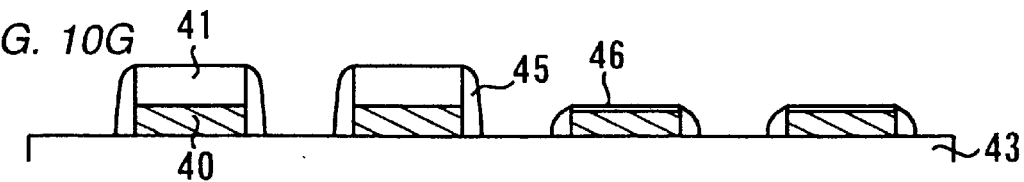

With the resist film 44' used as a mask, dry etching is carried out until the insulating film 43 is exposed in the second region. The dry etching process forms the second group wires constituted by the conductive layer 40 in the second region. when the etching process is completed, the resist film 44' is removed (FIG. 10F).

As described, the seventh embodiment allows the resist film 44 for forming the first group wires and the resist film 44' for constructing the second group wires to be patterned in separate steps. This makes it possible to fabricate the first and second group wires with a high degree of precision regardless of the wiring density difference between the two groups.

According to the seventh embodiment, the etching step to remove the conductive layer 40 from the first region with the insulating film 41 used as a mask is executed independently of the etching step to remove of the conductive layer 40 from the second region with the resist film 44' employed as a mask. It is known that the optimum conditions for etching with the insulating film 41 used as the mask may not be the same as the optimum conditions for etching with the resist film 44' utilized as the mask. Because the seventh embodiment is fit for performing the two separate etching steps under their optimum conditions, the first and second group wires are all formed with a high degree of precision.

With the seventh embodiment, the first and the second group of wiring differ structurally. Thus, if the conductive layer 40 is constituted by implanted polysilicon or by doped polysilicon, then it is possible to provide the two groups of wires with different resistivities as in the case of the sixth embodiment, by forming side walls 45 and a salicide films 46 (see FIG. 10G), or by forming a salicide films over exposed first and second group wires without construction of the side walls 45.

Eighth Embodiment

An eighth embodiment of this invention will now be described with reference to FIGS. 11A to 11E. FIGS. 11A to 11E are explanatory views illustrating a method practiced as the eighth embodiment of the invention for manufacturing a semiconductor device. The eighth embodiment is another method for forming wires on a semiconductor substrate.

Figure 11A:
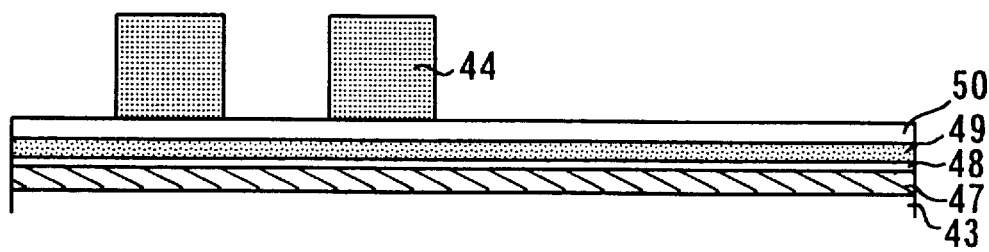
FIGS. 11A to 11E are sectional views for describing a manufacturing method of a semiconductor device according to a eighth embodiment of the present invention.

According to the eighth embodiment, a polysilicon layer 47, a stopper film 48, a silicide film 49 and an insulating film 50 are deposited one upon another on an insulating film 43 (FIG. 11A). The polysilicon layer 47 is constituted by implanted polysilicon or by doped polysilicon. The stopper film 48 is formed with a silicon oxide film or silicon nitride film. The silicide film 49 is made illustratively of a tungsten silicide film. The insulating film 50 is formed with a silicon oxide film.

The area of the semiconductor substrate is divided into a first region where first group wires are to be formed and a second region where second group wires are to be manufactured. With the eighth embodiment, a resist film 44 is formed in the first region on the insulating film 50. The resist film 44 is patterned in corresponding relation to the first group wires (FIG. 11A).

Figure 11B:
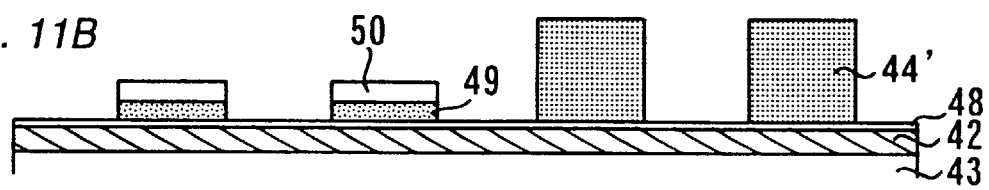

With the resist film 44 used as a mask, dry etching is carried out to remove the insulating film 50 and silicide film 49. The advance of the dry etching process is halted by the stopper film 48. The etching process leaves the insulating film 50 and silicide film 49 patterned as desired in the first region. A resist film 44' is formed on the stopper film 48 in the second region. The resist film 44' is patterned so as to correspond to the second group wires (FIG. 11B).

Figure 11C:
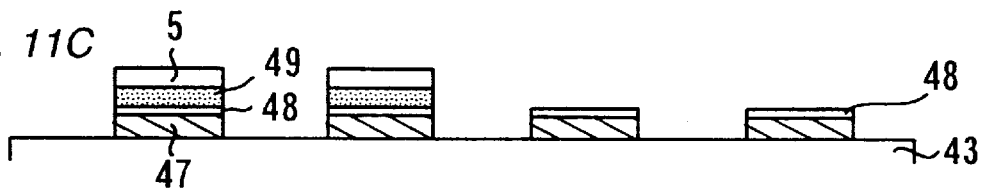

Dry etching is performed until the insulating layer 43 is exposed while the insulating film 50 and silicide film 49 patterned in the first region and the resist film 44' patterned in the second region are being used as masks. The dry etching process forms the first group wires comprising the polysilicon layer 47, stopper film 48, silicide film 49 and insulating film 50 in the first region, and the second group wires including the polysilicon layer 47 and stopper film 48 in the second region (FIG. 11C).

Figure 11D:
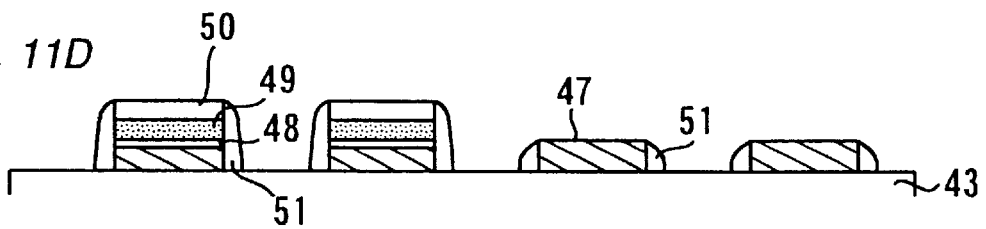

Side walls 51 are formed to cover the sides of the first and second group wires. During an etching process to form the side walls 51, the stopper film 48 is removed simultaneously from the gate electrodes in the second region (FIG. 11D).

Figure 11E:
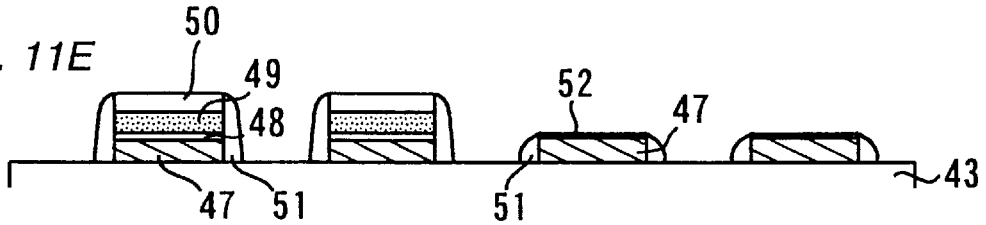

Metal such as cobalt or tungsten is then deposited all over the semiconductor substrate. The metal depositing process forms a salicide film 52 in a self-aligning fashion on the surface of the second group wires (FIG. 11E).

As described, the eighth embodiment allows the resist film 44 for forming the first group wires and the resist film 44' for constructing the second group wires to be patterned in separate steps. This makes it possible to fabricate the first and second group wires with a high degree of precision regardless of the wiring density difference between the two groups.

The eighth embodiment also makes it possible to form the first group wires in a silicide structure and the second group wires in a structure containing the salicide film 52. Thus the eighth embodiment is suitable for manufacturing a semiconductor device in which the wires in the first and second groups have significantly small resistance values.

The major benefits of the present invention described above are summarized as follows:

A manufacturing method of a semiconductor device according to one aspect of the present invention allows a high-density region pattern and a low-density region pattern to be transferred in separate steps. That is, the inventive method is capable of transferring dense and sparse patterns separately under optimum conditions in accordance with the respective pattern densities. This makes it possible to form all circuit patterns with high degrees of precision on the semiconductor substrate.

A manufacturing method according to the second aspect of the present invention may preferably permit the high- and the low-density region pattern to be transferred using resist materials fit for the respective processes of transfer. This also makes it possible to form all circuit patterns with high degrees of precision on the semiconductor substrate.

A manufacturing method of a semiconductor device according to the third aspect of the present invention may preferably permit executing etching processes in separate steps in a high- and a low-density region. That is, the inventive method is capable of separately performing the etching processes for forming a high- and a low-density pattern under optimum conditions in accordance with the respective pattern densities. This also makes it possible to form all circuit patterns with high degrees of precision on the semiconductor substrate.

A manufacturing method of a semiconductor device according to the fourth aspect of the present invention may preferably permit precisely forming gate electrodes with a high degree of integration in a DRAM and gate electrodes with a relatively low degree of integration in peripheral circuits on the same semiconductor substrate.

A manufacturing method of a semiconductor device according to the fifth aspect of the present invention may preferably permit forming a circuit pattern of a dual layer structure made of a conductive layer and an insulating film in a high-density region, and a circuit pattern of a single layer structure composed of the conductive layer alone in a low-density region. The inventive method thus allows two differently structured circuit patterns to be formed with a high degree of precision on the same semiconductor substrate.

A manufacturing method of a semiconductor device according to the sixth aspect of the present invention may preferably permit forming salicide films in a self-aligning fashion on circuit patterns by depositing metal from above these patterns. The areas of the salicide films furnished on, say, two circuit patterns differ due to differences in circuit pattern structure. Thus the inventive method allows two circuit patterns having different resistivities to be manufactured on the same semiconductor substrate.

A manufacturing method of a semiconductor device according to the seventh aspect of the present invention may preferably permit forming a silicide structure circuit pattern in a high-density region and a circuit pattern containing a salicide film in a low-density region. The inventive method is thus fit for manufacturing a semiconductor device whose high- and low-density regions have circuit patterns of low resistance values, i.e., a semiconductor device suitable for high-speed operations.

A manufacturing method of a semiconductor device according to the eighth aspect of the present invention divides circuit patterns to be formed into a first and a second group pattern subject to pattern transfer. The inventive method ensures a wide pitch for the pattern to be transferred in a single pass of photolithography, whereby circuit pattern manufacturing steps are facilitated.

A manufacturing method of a semiconductor device according to the ninth aspect of the present invention may preferably permit transferring separately in a first and a second group pattern the gate electrodes of a DRAM that requires a high degree of integration. This makes it possible to fabricate the gate electrodes of the DRAM easily and with a high degree of precision.

A manufacturing method of a semiconductor device according to the tenth aspect of the present invention may preferably permit transferring separately in a first and a second group pattern the wires that require a high degree of integration. This makes it possible to fabricate the wires easily and with high degree of precision.

A manufacturing method of a semiconductor device according to the eleventh aspect of the present invention may preferably permit forming a first group pattern of a dual layer structure made of a conductive layer and an insulating film, and a second group pattern of a single layer structure composed of the conductive layer alone. This makes it possible to form two differently structured circuit patterns with a high degree of precision on the same semiconductor substrate while ensuring a wide pattern pitch for photolithography.

A manufacturing method of a semiconductor device according to the twelfth aspect of the invention may preferably permit forming a first and a second group pattern each with a dual layer structure made of a conductive layer and an insulating film. This makes it possible to unify the structures of different circuit patterns formed on the same semiconductor substrate while ensuring a wide pattern pitch for photolithography.

A manufacturing method of a semiconductor device according to the thirteenth aspect of the present invention permits transferring a first and a second group pattern in separate steps and carrying out etching processes separately to form the two patterns. The inventive method is thus fit for manufacturing the first and the second group pattern separately under optimum conditions with a high degree of precision.

Further, the present invention is not limited to these embodiments, but variations and modifications may be made without departing from the scope of the present invention.

The entire disclosure of Japanese Patent Application No. Hei 11-186526 filed on Jun. 30, 1999 including specification, claims, drawings and summary are incorporated herein by reference in its entirety.

What is claimed is:

1. A manufacturing method of a semiconductor device for forming desired circuit patterns on a semiconductor substrate, regions of said semiconductor substrate being divided into a high-density region principally including a high-density pattern and a low-density region principally including a low-density pattern, said manufacturing method of a semiconductor device comprising the steps of:

forming a conductive layer on said semiconductor substrate before pattern transfer;

transferring the high-density pattern to said high-density region by photolithography;

transferring the low-density pattern to said low-density region by photolithography separate from said step of transferring the high-density pattern to said high-density region; and forming on said semiconductor substrate the patterns transferred to said high-density region and said low-density region, wherein both the high density pattern and the low-density pattern are transferred to the conductive layer.

2. The manufacturing method of a semiconductor device according to claim 1, wherein:

said photolithography in said high-density region is performed using a first resist material suitable for forming patterns of a high density; and said photolithography in said low-density region is carried out using a second resist material more suitable for forming patterns of a low density than said first resist material.

3. The manufacturing method of a semiconductor device according to claim 1, further comprising the steps of:

carrying out etching to form the pattern in said high-density region while protecting said low-density region; and carrying out etching to form the pattern in said low-density region while protecting said high-density region.

4. The manufacturing method of a semiconductor device according to claim 1, wherein:

said semiconductor substrate comprises a DRAM area in which to form DRAM components and a peripheral circuit area in which to form peripheral circuits;

said high-density region includes gate electrodes of transistors formed as DRAM components; and said low-density region comprises gate electrodes of transistors manufactured as peripheral circuit components.

5. The manufacturing method of a semiconductor device according to claim 1, further comprising the steps of:

forming an insulating film on said semiconductor substrate before pattern transfer;

forming a first resist film of a desired shape on said insulating film in said high-density region;

etching said insulating film using said first resist film as a mask;

forming a second resist film on a desired shape in said low-density region after said etching; and etching said conductive layer while said insulating film in said high-density region and said second resist in said low-density region are being used as masks.

6. The manufacturing method of a semiconductor device according to claim 5, wherein said conductive layer is a silicon film including impurities; and said manufacturing method of a semiconductor device further comprising the step of depositing metal all over said semiconductor substrate for silicide formation thereon after removal of said second resist film.

7. The manufacturing method of a semiconductor device according to claim 4, further comprising the steps of:

forming a silicon film including impurities, a silicide film and an insulating film on said semiconductor substrate before pattern transfer;

forming a first resist film of a desired shape on said insulating film in said high-density region;

etching said insulating film and said silicide film using said first resist film as a mask;

forming a second resist film of a desired shape in said low-density region after said etching;

etching said silicon film while said insulating film in said high-density region and said second resist film in said low-density region are being used as masks; and depositing metal all over said semiconductor substrate for silicide formation thereon after removal of said second resist film.

8. A manufacturing method of a semiconductor device for forming desired circuit patterns on a semiconductor substrate, said desired circuit patterns being divided into a first and a second group pattern, said manufacturing method comprising the steps of:

transferring said first group pattern by photolithography;

transferring said second group pattern by photolithography; and forming said first and said second group pattern on said semiconductor substrate;

wherein said first group pattern principally has a larger pitch than the circuit patterns to be formed; and wherein said second group pattern principally has a larger pitch than said circuit patterns to be formed.

9. The manufacturing method of a semiconductor device according to claim 8, wherein gate electrodes of transistors serving as DRAM components are divided into said first and said second group pattern.

10. The manufacturing method of a semiconductor device according to claim 8, wherein patterns of wires to be formed on said semiconductor substrate are divided into said first and said second group pattern.

11. The manufacturing method of a semiconductor device according to claim 8, further comprising the steps of:

forming a conductive layer and an insulating film on said semiconductor substrate before pattern transfer;

forming a first resist film corresponding to said first group pattern on said insulating film;

etching said insulating film using said first resist film as a mask;

forming a second resist film corresponding to said second group pattern after said etching; and etching said conductive layer while said insulating film left on said conductive layer and said second resist film are being used as masks.

12. The manufacturing method of a semiconductor device according to claim 8, further comprising the steps of:

forming, before pattern transfer, a conductive layer, an insulating film, and a conductive layer equivalent film showing the same etching rate as that of said conductive layer on said semiconductor substrate;

forming a first resist film corresponding to said first group pattern on said conductive layer equivalent film;

etching said conductive layer equivalent film using said first resist film as a mask;

forming a second resist film corresponding to said second group pattern after said etching;

etching said insulating film while said conductive layer equivalent film left on said insulating film and said second resist film are being used as masks; and etching said conductive layer using said insulating film as a mask while removing through etching said conductive layer equivalent film left on said insulating film.

13. A manufacturing method of a semiconductor device for forming desired circuit patterns on a semiconductor substrate, regions of said semiconductor substrate being divided into a first region in which to form a first group pattern and a second region in which to form a second group pattern, said manufacturing method comprising the steps of:

forming a conductive layer and an insulating film on said semiconductor substrate;

forming a first resist film corresponding to said first group pattern on said insulating film in said first region;

etching said insulating film using said first resist film as a mask;

etching, while said insulating film left in said first region is being used as a mask, portions of said conductive layer which are exposed in said first region with said second region protected;

forming a second resist film which covers said first region and locations corresponding to said second group pattern; and etching, with said second resist film used as a mask, portions of said conductive layer which are exposed in said second region.

* * * * *